United States Patent
Kagami et al.

(10) Patent No.: US 7,715,155 B2
(45) Date of Patent: May 11, 2010

(54) THIN-FILM MAGNETIC HEAD AND MANUFACTURING METHOD THEREOF

(75) Inventors: Takeo Kagami, Tokyo (JP); Kazuki Sato, Tokyo (JP); Kosuke Tanaka, Tokyo (JP); Takayasu Kanaya, Tokyo (JP); Naoki Ohta, Tokyo (JP)

(73) Assignee: TDK Corporation, Tokyo (JP)

( * ) Notice: Subject to any disclaimer, the term of this patent is extended or adjusted under 35 U.S.C. 154(b) by 559 days.

(21) Appl. No.: 11/734,047

(22) Filed: Apr. 11, 2007

(65) Prior Publication Data

US 2008/0253037 A1  Oct. 16, 2008

(51) Int. Cl.
*G11B 5/33* (2006.01)

(52) U.S. Cl. .................................. 360/324.12

(58) Field of Classification Search .................. 360/319, 360/324.2, 324.12, 324.11, 324.1, 119.01, 360/119.02, 119.03, 119.04
See application file for complete search history.

(56) References Cited

U.S. PATENT DOCUMENTS 6,483,675 B1 * 11/2002 Araki et al. .............. 360/324.2
7,369,375 B2 * 5/2008 Hayashi et al. ........ 360/324.12
2005/0219772 A1 * 10/2005 Hayashi et al. .......... 360/324.2

FOREIGN PATENT DOCUMENTS

| JP | 08-45035 | 2/1996 |
| JP | 2003-203313 | 7/2003 |
| JP | 2004-206822 | 7/2004 |
| JP | 2005-135514 | 5/2005 |

* cited by examiner

*Primary Examiner*—Angel A. Castro
(74) *Attorney, Agent, or Firm*—Frommer, Lawrence & Haug LLP (57) ABSTRACT

A thin-film magnetic head includes a lower magnetic shield layer, an MR multi-layered structure formed on the lower magnetic shield layer so that current flows in a direction perpendicular to surfaces of laminated layers, an insulation layer formed to surround the MR multi-layered structure, an additional metal layer laminated on at least the MR multi-layered structure, an upper electrode layer made of a soft magnetic material laminated on the additional metal layer and the insulation layer, and an upper magnetic shield layer laminated on the upper electrode layer. The additional metal layer has a multi-layered structure including a nonmagnetic metal layer and a soft magnetic layer laminated on the nonmagnetic metal layer, and has a length along a track-width direction of the MR multi-layered structure larger than a width of a magnetization-free layer in the MR effect multi-layered structure.

11 Claims, 10 Drawing Sheets

Fig. 10

THIN-FILM MAGNETIC HEAD AND MANUFACTURING METHOD THEREOF

BACKGROUND OF THE INVENTION

1. Field of the Invention

The present invention relates to a thin-film magnetic head with a magnetoresistive effect (MR) element for detecting magnetic intensity in a magnetic recording medium and for outputting a read signal, and to a manufacturing method of the thin-film magnetic head.

2. Description of the Related Art

Recently, in order to satisfy the demand for higher recording density and downsizing in a hard disk drive (HDD) apparatus, higher sensitivity and resolution of a thin-film magnetic head are required. Thus, as for a thin-film magnetic head with a recording density performance of 100 Gbspi or more, a tunnel magnetoresistive effect (TMR) head with a TMR read head element having a current perpendicular to plane (CPP) structure capable of achieving higher sensitivity and resolution is coming into practical use instead of a general giant magnetoresistive effect (GMR) head with a GMR read head element having a current in plane (CIP) structure.

The head structure in which a sense current flows in a direction parallel with surfaces of laminated layers is called as the CIP structure, whereas the other head structure in which the sense current flows in a direction perpendicular to surfaces of laminated layers is called as the CPP structure. In recent years, GMR heads with the CPP structure are being developed.

Because the CPP structure utilizes magnetic shield layers themselves as electrodes, short-circuit or insufficient insulation between magnetic shield layers and element layer, which had been serious problem for narrowing the read gap in the CIP structure never inherently occurs. Therefore, the CPP structure lends itself to a high recording density head.

Even in the thin-film magnetic head with the CPP structure capable of narrowing the read gap, when it is required to further narrow the read gap in order to scale up high recording density performance, the following problems become serious:

(1) Thickness of the read gap varies widely not only in each wafer but also between wafers; and
(2) Read output becomes unstable due to possible magnetic coupling between a magnetic shield layer and a hard bias layer, and also possible magnetic coupling between a magnetic shield layer and a free layer.

FIGS. 1a to 1h show plane views and sectional views illustrating a part of a conventional fabrication process of a TMR head.

Figure 1A:
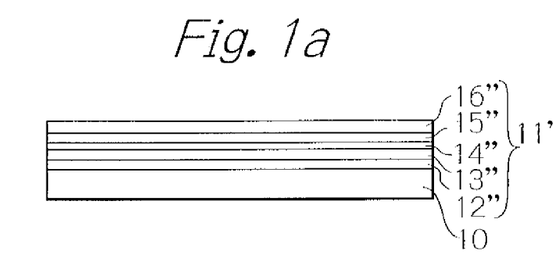
FIGS. 1a to 1h already disclosed show plane views and sectional views illustrating a part of a conventional fabrication process of a TMR head.
Figure 1B:
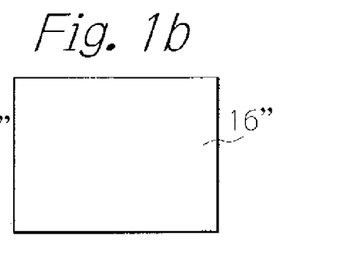

First, as shown in FIGS. 1a and 1b, a lower electrode and magnetic shield layer 10 is deposited on an insulation layer (not shown) formed on a substrate (not shown). Then, a film for a lower metal layer 12", films for a magnetization-fixed layer (pin layer and pinned layer) 13", a film for a tunnel barrier layer 14", films for a magnetization-free layer (free layer) 15" and a film for a cap layer 16", which constitute an MR multi-layered film 11" are sequentially deposited thereon.

Figure 1C:
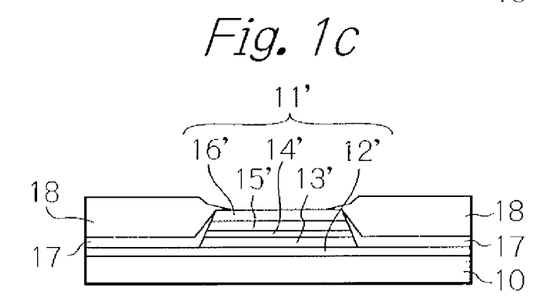
Figure 1D:
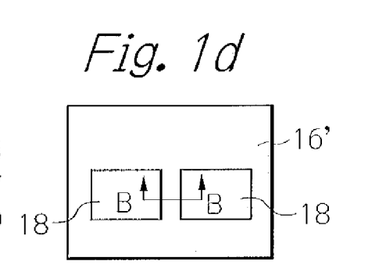

Then, a photo-resist pattern of two-layers structure is formed thereon, and the MR multi-layered film 11" is patterned by ion milling to obtain an MR multi-layered film 11'. Thereafter, a film for an insulation layer 17 and a film for a hard magnetic layer (magnetic bias layer) 18 are deposited thereon, and the photo-resist pattern is removed or lifted-off to obtain the insulation layer 17 and the hard magnetic layer 18 as shown in FIGS. 1c and 1d.

Figure 1E:
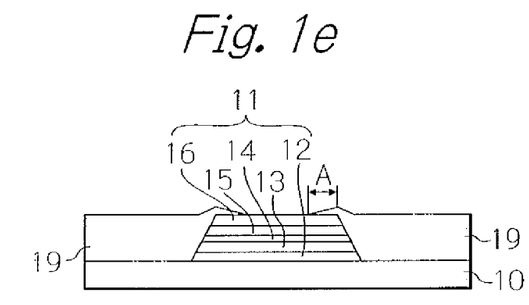
Figure 1F:
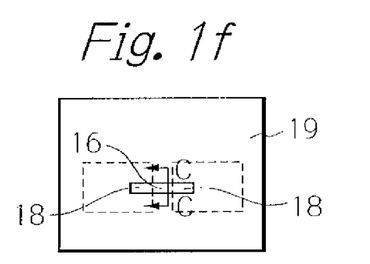

Then, a photo-resist pattern of two-layers structure is formed thereon, and the MR multi-layered film 11' is further patterned for defining its length in the MR-height direction by ion milling to obtain an MR multi-layered structure 11 with a lower metal layer 12, a magnetization-fixed layer (pin layer and pinned layer) 13, a tunnel barrier layer 14, a magnetization-free layer (free layer) 15 and a cap layer 16. Thereafter, an insulation layer is deposited thereon by sputtering, and the photo-resist pattern is removed or lifted-off to obtain a patterned insulation layer 19 as shown in FIGS. 1e and 1f. It should be noted that FIG. 1e shows a C-C line section of FIG. 1f seen from a different direction as that of FIG. 1c that shows a B-B line section of FIG. 1d.

Figure 1G:
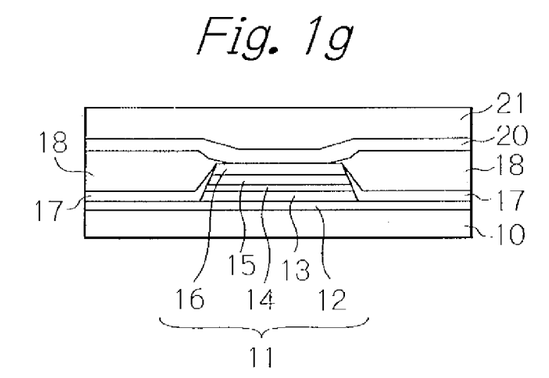
Figure 1H:
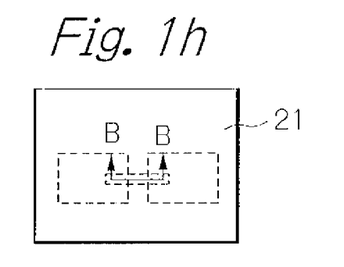

Then, an upper metal layer 20 and an upper electrode and magnetic shield layer 21 are deposited thereon as shown in FIGS. 1g and 1h.

FIGS. 2a to 2d show C-C line sectional views of FIG. 1f illustrating in detail the lift-off process for forming the patterned insulation layer 19. These figures indicate a region of the MR multi-layered structure opposite to that to be formed as an air bearing surface (ABS), in other words, these figures indicate a region that will not be removed by an MR-height adjusting process performed after the wafer process.

Figures 2A, 2B:
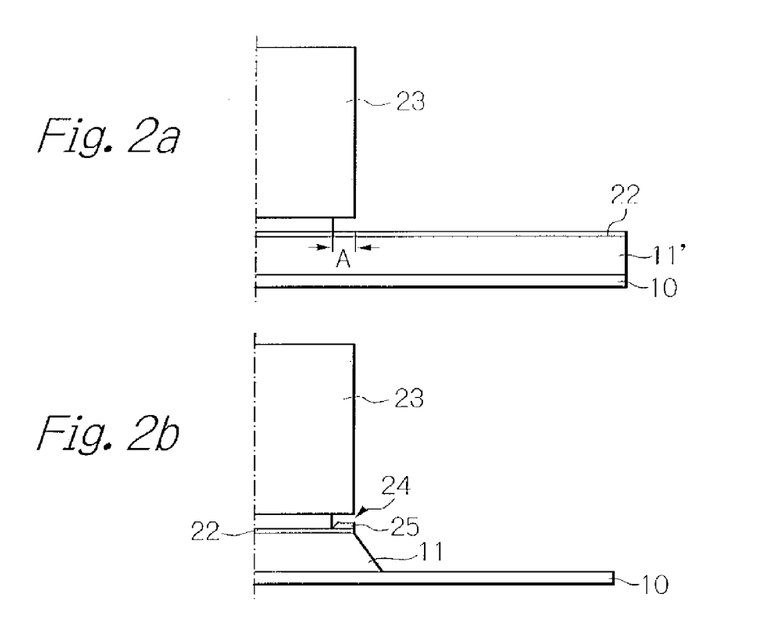
FIGS. 2a to 2d already disclosed show sectional views seen from C-C line of FIG. 1f illustrating in detail a lift-off process of an insulation layer.

In this lift-off process, first, a two-layered photo-resist pattern 23 is formed on a surface-oxidized film 22 deposited on the MR multi-layered film 11' as shown in FIG. 2a.

Then, as shown in FIG. 2b, the MR multi-layered film 11' is patterned by ion milling to obtain the MR multi-layered structure 11. By this ion milling, a re-deposition 25 may be formed on a region A of an undercut 24, that is, under a canopy of the two-layered photo-resist pattern 23.

Figure 2C:
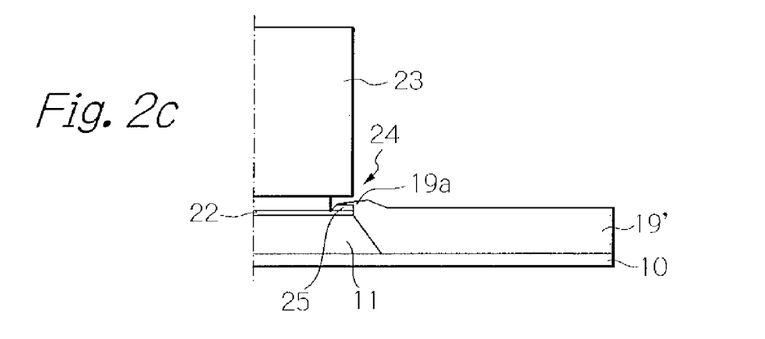

Then, as shown in FIG. 2c, an insulation layer 19' is deposited thereon by sputtering. By this sputtering, an overlapped part 19a of the insulation layer may be formed on the re-deposition in the region of the undercut 24.

Figure 2D:
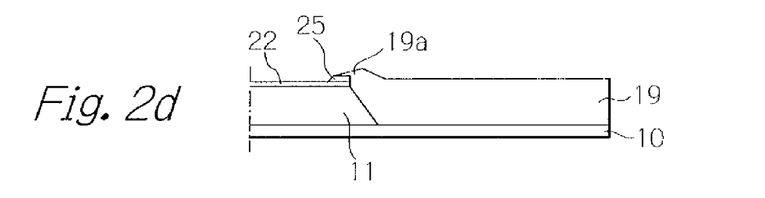

Thereafter, as shown in FIG. 2d, the two-layered photo-resist pattern 23 is removed and thus the lift-off process is completed.

Such lift-off process used for fabricating the conventional TMR head may cause to produce the overlapped part 19a of the insulation layer 19 in the region of the MR multi-layered structure 11 opposite to the ABS.

Such overlapped part 19a will induce the following serious problems after the MR-height adjustment. Because a target of the MR-height adjustment is decreased to 100 nm or less to satisfy the recent demand for higher recording density, the remaining region other than the region A, which keeps good electrical contact, becomes extremely narrow. Also, because the surface-oxidized film 22, the re-deposition 25 and the overlapped part 19a are formed in the region A, the electrical resistance in this region becomes very high. Therefore, the serial resistance component of the MR head increases causing deterioration in the MR performance and in the frequency characteristics of the MR head.

Figure 3A:
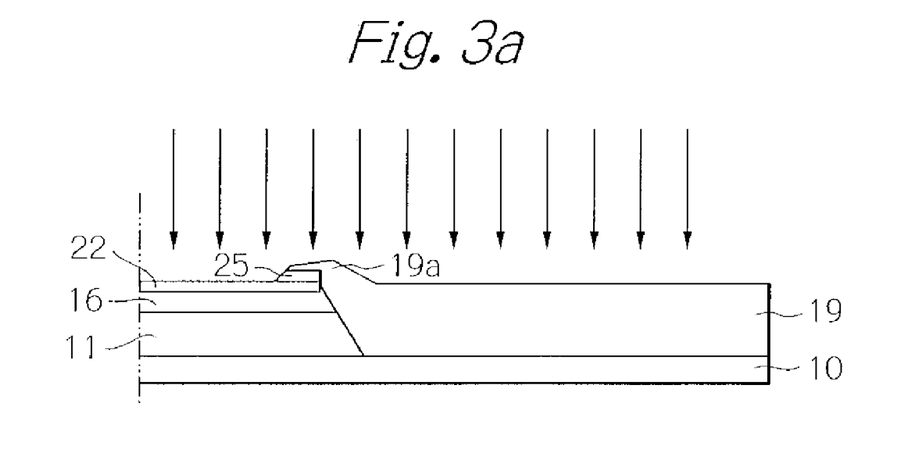
FIGS. 3a to 3c show sectional views illustrating a process of removing the overlapped part.
Figure 3B:
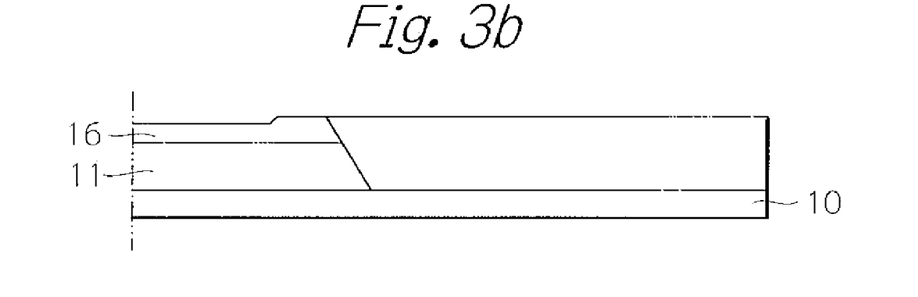
Figure 3C:
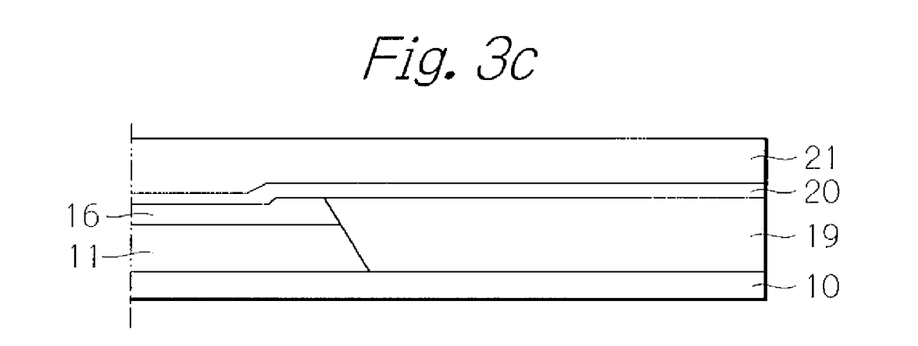

The overlapped part 19a formed in the region A may be removed by as shown in FIG. 3a performing dry etching before the upper metal layer 20 and the upper electrode and magnetic shield layer 21 are deposited, and by simultaneously removing as shown in FIG. 3b all of the overlapped part 19a of the insulation layer 19 and a part of the cap layer 16. Thereafter, the upper metal layer 20 and the upper electrode and magnetic shield layer 21 are deposited as shown in FIG. 3c.

By this dry etching process, it is necessary to remove the layers with a thickness that may be about 5-10 nm in terms of a Ta layer for example. If in this case unevenness in thickness is remained in the etched layers, this unevenness just will become as a thickness variation in the read gap.

In order to prevent such thickness variation in the read gap from occurring, Japanese patent publication No. 2004-206822 A discloses a manufacturing method of an MR element, wherein a soft magnetic layer is formed in a cap layer of the MR multi-layered film, which corresponds to the cap layer 16" shown in FIG. 1a, to use the formed soft magnetic layer as a part of the upper shield layer. According to this manufacturing method, because no fabrication process that may deteriorate accuracy in thickness of the read gap exists between the forming process of the MR multi-layered structure and the forming process of the upper shield layer, it is possible to improve the thickness accuracy of the read gap.

However, in case that the cap layer of the MR multi-layered film is thick, it is difficult to form the upper ferromagnetic layer or free layer with a narrow width when the MR multi-layered film is patterned by ion milling. In other words, the cap layer is necessary to make thin as for example 5 nm or less thickness in order to form a narrow width free layer for increasing the recording density in the track direction.

SUMMARY OF THE INVENTION

It is therefore an object of the present invention to provide a thin-film magnetic head and a manufacturing method of a thin-film magnetic head, whereby thickness accuracy in a read gap can be improved and also a width of a free layer can be narrowed.

According to the present invention, a thin-film magnetic head includes a lower magnetic shield layer, an MR multi-layered structure formed on the lower magnetic shield layer so that current flows in a direction perpendicular to surfaces of laminated layers, an insulation layer formed to surround the MR multi-layered structure, an additional metal layer laminated on at least the MR multi-layered structure, an upper electrode layer made of a soft magnetic material laminated on the additional metal layer and the insulation layer, and an upper magnetic shield layer laminated on the upper electrode layer. The additional metal layer has a multi-layered structure including a nonmagnetic metal layer and a soft magnetic layer laminated on the nonmagnetic metal layer, and has a length along a track-width direction of the MR multi-layered structure larger than a width of a magnetization-free layer in the MR effect multi-layered structure.

The additional metal layer has a multi-layered structure with the nonmagnetic metal layer and the soft magnetic layer laminated in this order from the bottom. Thus, the soft magnetic layer serves a part of the upper magnetic shield layer that is made of the soft magnetic material. Therefore, the nonmagnetic metal layer of the additional metal layer will define the read gap. Because the nonmagnetic metal layer is not etched, it is possible to keep its thickness quite uniform as is deposited. As a result, precision in thickness of the read gap can be greatly improved. Also, since a cap layer in the MR multi-layered structure can be formed to keep thin, it is possible to narrow the width of the free layer.

It is preferred that the additional metal layer has a length being substantially the same as that of the MR multi-layered structure, along a direction perpendicular to the track-width direction of the MR multi-layered structure. Because the soft magnetic layer of the additional metal layer has elongated shape running along the track-width direction, the magnetic domain of the upper magnetic shield layer around the MR multi-layered structure becomes stable to stabilize the read output even if the MR element has a narrow read gap structure.

It is also preferred that the upper electrode layer is laminated on and directly joined with the soft magnetic layer of the additional metal layer.

It is further preferred that the upper electrode layer and the upper magnetic shield layer are integrally formed.

It is still further preferred that the additional metal layer further has an additional nonmagnetic metal layer or an additional anti-ferromagnetic layer laminated on the soft magnetic layer, and that the upper electrode layer is laminated on the additional nonmagnetic metal layer or the additional anti-ferromagnetic layer of the additional metal layer.

It is further preferred that the upper electrode layer is laminated on an additional nonmagnetic metal layer or an additional anti-ferromagnetic layer that is laminated on the soft magnetic layer of the additional metal layer, and that the additional nonmagnetic metal layer or the additional anti-ferromagnetic layer has the same plane shape as the upper magnetic shield layer.

It is still further preferred that the soft magnetic layer of the additional metal layer is made of the same soft magnetic material as the upper magnetic shield layer.

It is further preferred that the soft magnetic layer of the additional metal layer is made of a soft magnetic material different from that of the upper magnetic shield layer.

It is still further preferred that the MR multi-layered structure is a TMR multi-layered structure or a CPP-GMR multi-layered structure.

According to the present invention, also, a manufacturing method of a thin-film magnetic head includes a step of depositing MR multi-layered films on a lower magnetic shield layer, a step of patterning the deposited MR multi-layered film to define a track width, a step of depositing multi-layered films for additional metal layer including a film for nonmagnetic metal layer and a film for soft magnetic layer laminated on the film for nonmagnetic metal layer, on the patterned MR multi-layered films, a step of patterning the multi-layered films for additional metal layer and the MR multi-layered films to define a length in a direction perpendicular to the track-width direction so as to obtain an additional metal layer and a MR multi-layered structure, a step of, thereafter, forming an upper electrode layer made of a soft magnetic material on the additional metal layer, and a step of forming an upper magnetic shield layer on the upper electrode layer.

The additional metal layer has a multi-layered structure with the nonmagnetic metal layer and the soft magnetic layer laminated in this order from the bottom. Thus, the soft magnetic layer serves a part of the upper magnetic shield layer that is made of the soft magnetic material. Therefore, the nonmagnetic metal layer of the additional metal layer will define the read gap. Because the nonmagnetic metal layer is not etched, it is possible to keep its thickness quite uniform as is deposited. As a result, precision in thickness of the read gap can be greatly improved. Also, since a cap layer in the MR multi-layered structure can be formed to keep thin, it is possible to narrow the width of the free layer.

After the patterning step for defining a track width, the films for additional metal layer are deposited and then the films for additional metal layer and the MR multi-layered films are patterned to define a length in a direction perpendicular to the track-width direction. Therefore, the additional metal layer is shaped such that its length along the track-width direction of the MR multi-layered structure is larger than the width of the free layer of the MR multi-layered structure and that its length along a direction perpendicular to the track-width direction is substantially the same as that of the MR multi-layered structure. Because the soft magnetic layer of the additional metal layer has thus elongated shape running along the track-width direction, the magnetic domain of the upper magnetic shield layer around the MR multi-layered structure becomes stable to stabilize the read output even if the MR element has a narrow read gap structure.

It is preferred that the method further includes a step of forming an insulation layer to surround the additional metal layer and the MR multi-layered structure, and a step of removing at least the insulation layer on the additional metal layer formed on the MR multi-layered structure by etching that terminates within the soft magnetic layer of the additional metal layer. In this case, preferably, the step of forming the insulation layer includes forming the insulation layer by a lift-off process using a patterning mask for defining the length of the MR multi-layered films in a direction perpendicular to the track-width direction. Also, preferably, the step of removing at least the insulation layer includes dry-etching at least the insulation layer. Further, preferably, the step of removing at least the insulation layer only consists of dry-etching at least the insulation layer. More, preferably, the step of forming an upper electrode layer is continuously performed without opening to air after the dry-etching at least the insulation layer. Still further, preferably, the step of removing at least the insulation layer includes wet-etching at least the insulation layer.

It is preferred that the step of forming an upper electrode layer and the step of forming an upper magnetic shield layer are dry-deposition processes continuously performed.

It is also preferred that the step of depositing multi-layered films for additional metal layer includes laminating a film for additional nonmagnetic metal layer or additional anti-ferromagnetic layer on the film for soft magnetic layer, and that the step of forming an upper electrode layer includes laminating the upper electrode layer on the additional nonmagnetic metal layer or the additional anti-ferromagnetic layer.

It is further preferred that the step of forming an upper electrode layer includes laminating an additional nonmagnetic metal layer or an additional anti-ferromagnetic layer on the soft magnetic layer of the additional metal layer, and that the step of forming an upper electrode layer includes laminating the upper electrode layer on the additional nonmagnetic metal layer or the additional anti-ferromagnetic layer.

It is further preferred that the film for soft magnetic layer and the upper electrode layer are made of the same soft magnetic material.

It is still further preferred that the film for soft magnetic layer and the upper electrode layer are made of different soft magnetic materials each other.

It is further preferred that the MR multi-layered structure is a TMR multi-layered structure or a CPP-GMR multi-layered structure.

It is further preferred that the method further includes a step of forming many thin-film magnetic heads on a wafer, a step of cutting the wafer into a plurality of bars so that each bar has a plurality of thin-film magnetic heads aligned with each other, a step of lapping each bar, and a step of separating the lapped bar into a plurality of individual thin-film magnetic heads.

Further objects and advantages of the present invention will be apparent from the following description of preferred embodiments of the invention as illustrated in the accompanying drawings.

DESCRIPTION OF THE PREFERRED EMBODIMENTS

Figure 4:
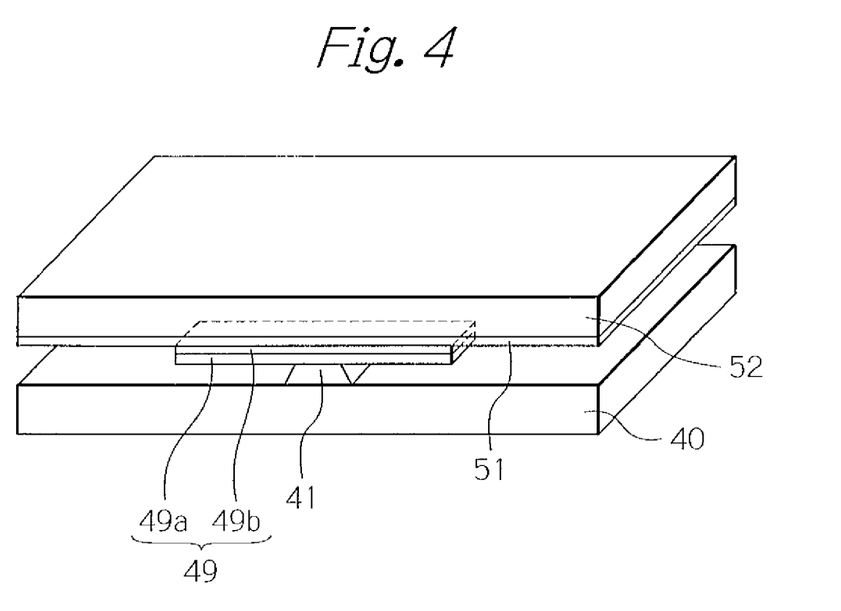
FIG. 4 shows a perspective view schematically illustrating a TMR read head element part of a thin-film magnetic head after an MR-height adjustment process as a first embodiment according to the present invention.

FIG. 4 schematically illustrates a TMR read head element part of a thin-film magnetic head after an MR-height adjustment process as a first embodiment according to the present invention. In the figure, to ensure greater ease in understanding the present invention, indicated are only main layers.

As shown in the figure, a TMR multi-layered structure 41, an additional metal layer 49 and an upper electrode layer 51 are formed between a lower magnetic shield layer 40 that doubles as a lower electrode and an upper magnetic shield layer 52 that doubles as an upper electrode. The additional metal layer 49 has a two-layered structure with a nonmagnetic metal layer 49a and a soft magnetic layer 49b laminated on the nonmagnetic metal layer 49a. A length of the additional metal layer 49 along a track-width direction of the TMR multi-layered structure 41 is larger than a width of a free layer in the TMR multi-layered structure 41, and a length of the additional metal layer 49 along a direction perpendicular to the track-width direction of the TMR multi-layered structure 41, that is more precisely along a direction perpendicular to an air bearing surface (ABS) or along an MR-height direction, is substantially the same as a length of the TMR multi-layered structure 41 along this direction (MR height).

Figure 5A:
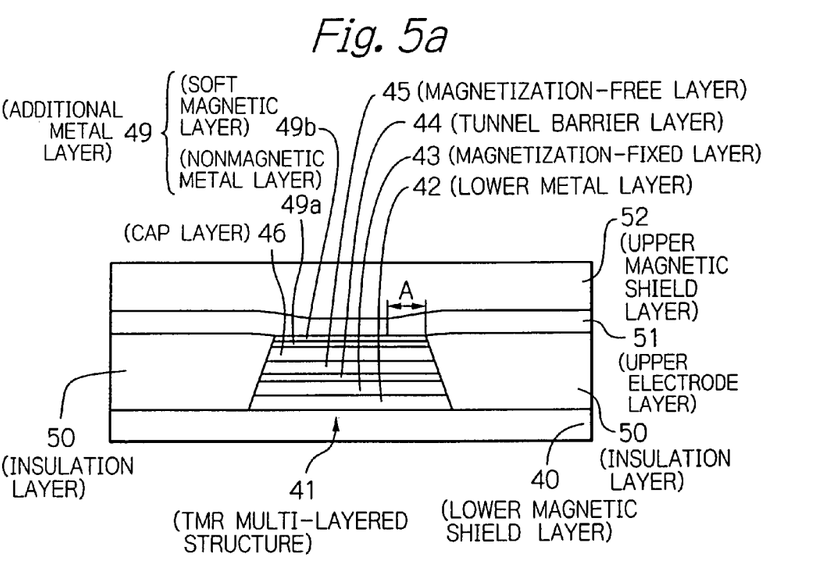
FIGS. 5a and 5b show sectional views illustrating more detail the TMR read head element part of the thin-film magnetic head before the MR-height adjustment process, in the first embodiment shown in FIG. 4.
Figure 5B:
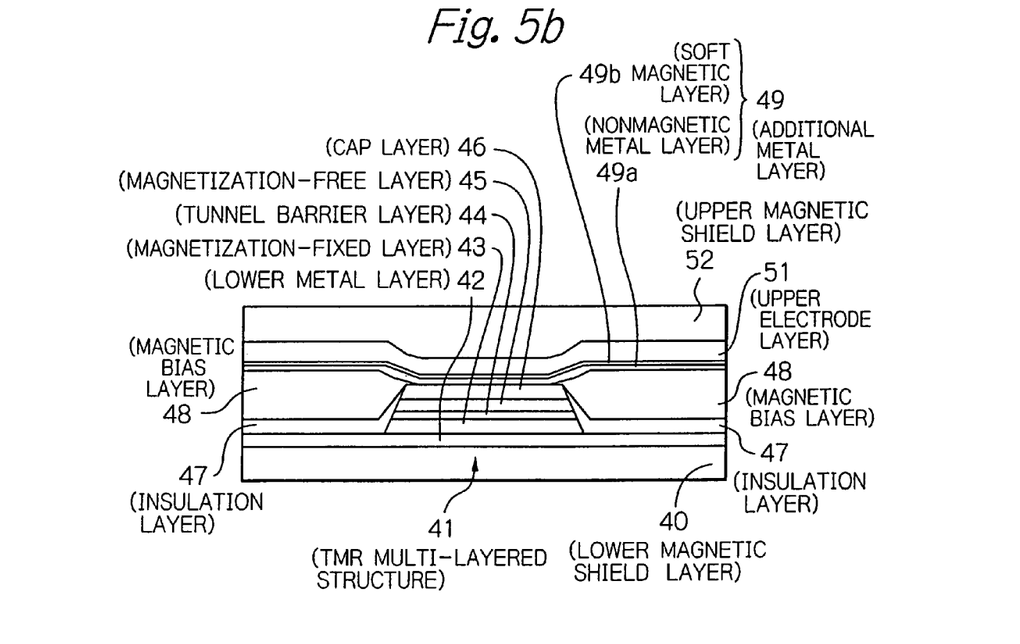

FIGS. 5a and 5b illustrate in detail the TMR read head element part of the thin-film magnetic head before the MR-height adjustment process, in the first embodiment shown in FIG. 4. It should be noted that FIG. 5a indicates a section of a plane perpendicular to the track-width direction, and FIG. 5b indicates a section of a plane parallel to the track-width direction.

As shown in these figures, the TMR read head element part of the thin-film magnetic head in the first embodiment has a lower magnetic shield layer 40 made of a soft magnetic material, a lower metal layer 42 made of a nonmagnetic metal material and laminated on the lower magnetic shield layer 40, and a TMR multi-layered structure 41 laminated thereon. The TMR multi-layered structure 41 has a magnetization-fixed layer 43 consisting of a pin layer made of an anti-ferromagnetic material and a pinned layer with multi-layers made of a ferromagnetic material and a nonmagnetic material, a tunnel barrier layer 44 made of an insulation material, a magnetization-free layer (free layer) 45 made of a ferromagnetic material, and a cap layer 46 made of a nonmagnetic metal material, laminated in this order. On right and left sides in the track-width direction of this TMR multi-layered structure 41, an insulation layer 47 made of an insulation material and a magnetic bias layer 48 made of a hard magnetic material are laminated in this order. Whereas, on front and back sides in the height direction of the TMR multi-layered structure 41, an insulation layer 50 made of an insulation material is formed.

The additional metal layer 49 is laminated on the TMR multi-layered structure 41 and the magnetic bias layer 48, and the upper electrode layer 51 made of a soft magnetic material and the upper magnetic shield layer 52 made of a soft magnetic material are laminated in this order on the additional metal layer 49 and the insulation layer 50.

As aforementioned, the additional metal layer 49 has a two-layered structure with the nonmagnetic metal layer 49a and the soft magnetic layer 49b laminated in this order from the bottom. In other words, the upper layer 49b of the additional metal layer 49 is made of a soft magnetic material. Whereas the upper electrode layer 51 is also made of a soft magnetic material. Thus, not only the upper electrode layer 51 but also the upper layer of the soft magnetic material 49b of the additional metal layer 49 serves a part of the upper magnetic shield layer, and the lower layer of the nonmagnetic metal material 49a of the additional metal layer 49 serves as a part of the cap layer 46 of the TMR multi-layered structure to define the read gap. Because the nonmagnetic metal layer 49a is not etched, it is possible to keep its thickness uniform as is deposited. Therefore, according to this first embodiment, precision in thickness of the read gap can be greatly improved. Also, since the cap layer can be formed to keep thin, it is possible to narrow the width of the free layer.

Furthermore, according to this first embodiment, the additional metal layer 49 is shaped such that its length along the track-width direction of the TMR multi-layered structure 41 is larger than the width of the free layer of the TMR multi-layered structure 41 and that its length along the MR-height direction is substantially the same as the MR height of the TMR multi-layered structure 41. Because the soft magnetic layer 49b of the additional metal layer 49 has such elongated shape running along the track-width direction, the magnetic domain of the upper magnetic shield layer around the TMR multi-layered structure becomes stable to stabilize the read output from the TMR read head element even if it has a narrow read gap structure.

FIGS. 6a to 6k illustrate a part of wafer process for fabricating the TMR read head element part of the thin-film magnetic head in the first embodiment. Hereinafter, wafer fabrication process of the thin-film magnetic head will be described with reference to these figures.

Figure 6A:
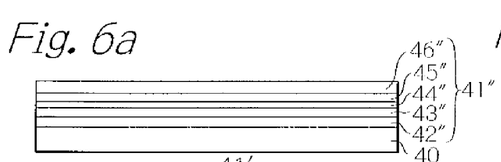
FIGS. 6a to 6k show plane views and sectional views illustrating a part of wafer process for fabricating the TMR read head element part of the thin-film magnetic head in the first embodiment.
Figure 6B:
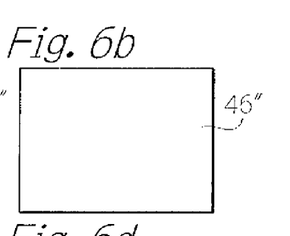

First, as shown in FIGS. 6a and 6b, a lower magnetic shield layer 40 which also functions as a lower electrode layer is deposited on an insulation layer (not shown) formed on a substrate (also not shown) made of a conductive material such as AlTiC ($Al_2O_3$—TiC). This lower magnetic shield layer 40 is formed by depositing a magnetic metal material such as nickel iron (NiFe), cobalt iron (CoFe), iron nickel cobalt (FeNiCo), iron aluminum silicide (FeAlSi), iron nitride (FeN), iron zirconium nitride (FeZrN), iron tantalum nitride (FeTaN), cobalt zirconium niobium (CoZrNb) or cobalt zirconium tantalum (CoZrTa) to have a thickness of about 100 to 3000 nm. In the desired embodiment, a NiFe film with a thickness of about 2000 nm is deposited as for the lower magnetic shield layer 40.

As shown in FIG. 6a, a TMR multi-layered film 41" is deposited thereon. The TMR multi-layered film 41" has films for a lower metal layer 42", film for a magnetization-fixed layer (pin layer and pinned layer) 43", a film for a tunnel barrier layer 44", films for a magnetization-free layer (free layer) 45" and a film for a cap layer 46" sequentially laminated each other. In this case, the film for the cap layer 46" is deposited as thinner than that for the conventional cap layer.

The films for a lower metal layer 42" shown in FIG. 6a consist of a film deposited by sputtering for example tantalum (Ta), chrome (Cr), hafnium (Hf), niobium (Nb), zirconium (Zr), titanium (Ti), molybdenum (Mo), tungsten (W) or the like to have a thickness of about 0.5 to 5 nm, and a film deposited by sputtering for example ruthenium (Ru), nickel chrome (NiCr), NiFe, nickel iron chrome (NiFeCr), cobalt (Co), CoFe or the like to have a thickness of about 1 to 6 nm. In a desired embodiment, as the film for the lower metal layer 42", a Ta film with a thickness of about 1 nm is deposited and an Ru film with a thickness of about 2 nm is deposited on the Ta film.

Films for the magnetization-fixed layer 43" shown in FIG. 6a are formed by sequentially depositing an anti-ferromagnetic film, a ferromagnetic film, a nonmagnetic film and a ferromagnetic film from the bottom in this order. In other words, this the magnetization-fixed layer 43' consists of a film for a pinning layer and films for a pinned layer. The film for a pinning layer is the anti-ferromagnetic film, and the films for a pinned layer are synthetic multi-layered films of the ferromagnetic film, the nonmagnetic film and the ferromagnetic film laminated from the bottom in this order. The film for a pinning layer consists of an anti-ferromagnetic layer of iridium manganese (IrMn), platinum manganese (PtMn), nickel manganese (NiMn), ruthenium rhodium manganese (RuRhMn) or the like deposited by sputtering to have a thickness of about 5 to 30 nm. The films for a pinned layer consist of a first ferromagnetic film (film for an outer pinned layer) made of CoFe or the like for example having a thickness of about 1 to 5 nm, a nonmagnetic film made of an alloy including one or at least two of Ru, rhodium (Rh), iridium (Ir), Cr, rhenium (Re), Cu or the like for example having a thickness of about 0.8 nm, and a second ferromagnetic film (film for an inner pinned layer) made of CoFe, CoFeSi, CoMnGe, CoMnSi, CoMnAl or the like for example having a thickness of about 1 to 3 mm, deposited sequentially by a sputtering method for example. In a desired embodiment, as the films for the magnetization-fixed layer 43", an IrMn film with a thickness of about 7 nm, a CoFe film with a thickness of about 2 nm, an Ru film with a thickness of about 0.8 nm and a CoFe film with a thickness of about 3 nm are stacked in this order from the bottom.

A film for the tunnel barrier layer 44" shown in FIG. 6a is made of an oxide including aluminum (Al), Ti, Ta, Zr, Hf, magnesium (Mg), silicon (Si) or zinc (Zn) having a thickness of about 0.5 to 1 nm. In a desired embodiment, as the film for the tunnel barrier layer 44", an $Al_2O_3$ film with a thickness of about 0.6 nm is deposited.

Films for the magnetization-free layer 45" shown in FIG. 6a consist of a high polarization film made of CoFe, CoFeSi, cobalt manganese germanium (CoMnGe), cobalt manganese silicon (CoMnSi), cobalt manganese aluminum (CoMnAl) or the like, with a thickness of about 1 nm, and a soft magnetic film made of NiFe or the like, with a thickness of about 1 to 9 nm sequentially deposited by a sputtering method, for example. In a desired embodiment, as the film for the magnetization-free layer 45", a CoFe film with a thickness of about 1 nm is deposited and a NiFe film with a thickness of about 3 nm is deposited on the CoFe film.

A film for the cap layer 46" shown in FIG. 6a is made of a nonmagnetic conductive material such as Ta, Ru, Hf, Nb, Zr, Ti, Cr, W or the like with a thickness of about 1 to 10 nm deposited to have a single layer structure or a two or more layers structure by a sputtering method for example. In a desired embodiment, as the film for the cap layer 46", a Ta film with a thickness of about 5 nm is deposited.

Then, a two-layered photo-resist pattern is formed thereon and the MR multi-layered film 41" is patterned by ion milling using the photo-resist pattern as a mask for defining a track width, so as to obtain a patterned MR multi-layered film 41'. In this case, because the cap layer 46" is thin, a width of the magnetization-free layer or free layer 45" can be made narrower than that of the photo-resist pattern. Then, a film for an insulation layer 47 and a film for a hard magnetic layer or magnetic bias layer 48 are deposited.

The film for an insulation layer 47 is formed from an insulation material such as $Al_2O_3$ or $SiO_2$ deposited by a sputtering method, an IBD (Ion Beam Deposition) method or the like to have a thickness of about 3 to 20 nm. The films for a magnetic bias layer 48 are formed from an under film made of Cr with a thickness of about 3 nm and a ferromagnetic film made of CoPt alloy for example with a thickness of about 10 to 40 nm deposited by a sputtering method or an IBD method for example, and from a bias protection film made of Ta for example with a thickness of about 5 nm deposited thereon by a sputtering method or an IBD method for example. In a desired embodiment, an $Al_2O_3$ film with a thickness of about 5 nm is deposited as the film for the insulation layer 47, a Cr film with a thickness of about 5 nm is deposited thereon as the under film for the bias magnetic layer 48, a CoPt film with a thickness of about 25 nm is deposited thereon as the ferromagnetic film for the bias magnetic layer 48, and a Ta film with a thickness of about 5 nm is deposited thereon as the bias protection film.

Figure 6C:
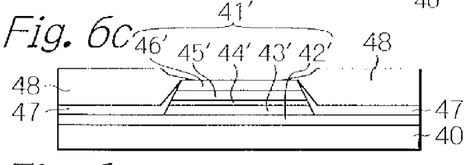
Figure 6D:
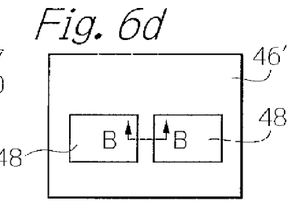

Thereafter, the photo-resist pattern is removed, namely the lift-off process is performed, so as to obtain an insulation layer 47 and a magnetic bias layer 48 as shown in FIGS. 6c and 6d.

Figure 6E:
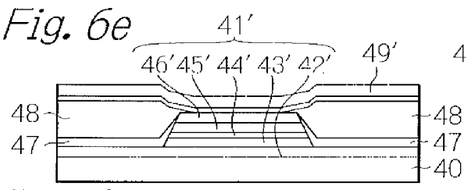
Figure 6F:
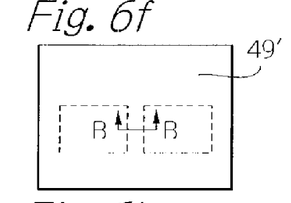

Then, as shown in FIGS. 6e and 6f, films for an additional metal layer 49' are deposited thereon by sputtering. The films for the additional metal layer 49' in the first embodiment have a two-layer structure with a nonmagnetic metal film and a soft magnetic film sequentially deposited from the bottom in this order. These films for the additional metal layer 49' are deposited in a post process executed after the patterning process for defining the track width of the MR multi-layered film 41". Concrete material and thickness of each film for the additional metal layer 49 will be described later.

Thereafter, a photo-resist pattern is formed on the films for the additional metal layer 49', and then the MR multi-layered film 41' is patterned by ion milling using the photo-resist pattern as a mask for defining a length perpendicular to the track width (length along the MR height), so as to obtain an MR multi-layered structure 41 consisting of a lower metal layer 42, a magnetization-fixed layer 43, a tunnel barrier layer 44, a magnetization-free layer 45 and a cap layer 46, and an additional metal layer 49 laminated thereon. Then, a film for an insulation layer is deposited thereon. This film for an insulation layer is formed from an insulation material such as $Al_2O_3$ or $SiO_2$ deposited by a sputtering method, an IBD method or the like to have a thickness of about 60 nm.

Figure 6G:
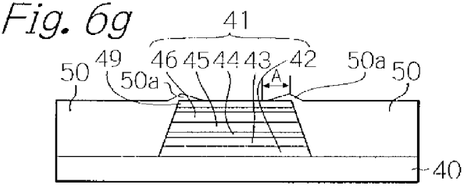
Figure 6H:
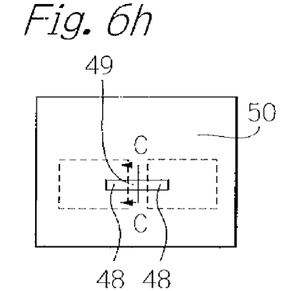

Then, the photo-resist pattern is removed, namely the lift-off process is performed, so as to obtain an insulation layer 50 as shown in FIGS. 6g and 6h. It should be noted that FIG. 6g shows a C-C line section of FIG. 6h seen from a different direction as that of FIG. 6e that shows a B-B line section of FIG. 6f.

Then, all of the overlapped part 50a of the insulation layer 50, the re-deposition and the oxidized layer there under, and a part of the soft magnetic layer 49b of the additional metal layer 49 are simultaneously removed by dry etching. It is important to control that the dry etching is terminated within the soft magnetic layer 49b but the nonmagnetic metal layer 49a is not etched at all. Thereafter, an upper electrode layer 51 and an upper magnetic shield layer 52 are deposited thereon as shown in FIGS. 6i, 6j and 6k.

The upper electrode layer 51 is formed by depositing a magnetic metal material such as NiFe, CoFe, FeAlSi, FeN, FeZrN, FeTaN, CoZrNb or CoZrTa, using a sputtering method for example, to have a thickness of about 10 to 100 nm. In a desired embodiment, a NiFe film with a thickness of about 50 nm is deposited as for the upper electrode layer 51.

The upper magnetic shield layer 52 is formed by depositing a magnetic metal material such as NiFe, CoFe, FeNiCo, FeAlSi, FeN, FeZrN, FeTaN, CoZrNb or CoZrTa, using a frame plating method for example, to have a thickness of about 100 to 3000 nm. In a desired embodiment, a NiFe film with a thickness of about 2000 nm is deposited as for the upper magnetic shield layer 52.

Figure 6I:
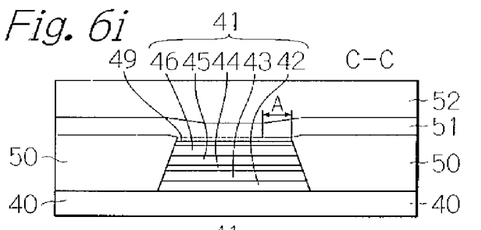
Figure 6J:
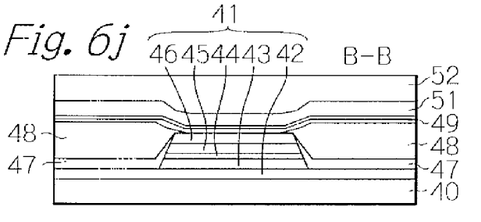
Figure 6K:
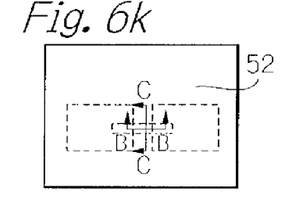

It should be noted that FIG. 6i shows a C-C line section of FIG. 6k seen from a different direction as that of FIG. 6j that shows a B-B line section of FIG. 6k. Because the re-deposition and the overlapped part formed in the rear end region A of the MR multi-layered structure 41 are completely removed, the head resistance can be reduced due to lowered sequential resistance component resulting both the MR performance and the frequency characteristics of the MR head to improve.

Instead of the simultaneous removing only by dry etching, the overlapped part 50a of the insulation layer 50 may be first removed by wet etching using a solvent that dissolve only the insulation layer 50 but never dissolves the additional metal layer 49, and then the re-deposition and the oxidized layer there under may be removed by dry etching.

Typically, write head elements are fabricated on thus formed read head elements to complete a thin-film magnetic head wafer.

Figure 7A:
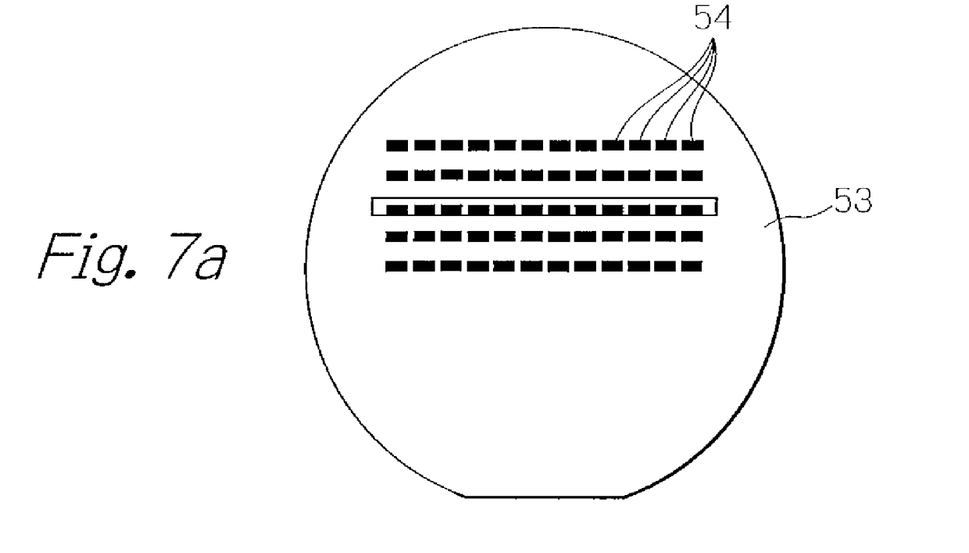
FIGS. 7a to 7c show a plane view, a perspective view and a side view illustrating processes of obtaining bars from the thin-film magnetic head wafer and adjusting the MR-height of the thin-film magnetic head in the first embodiment.
Figure 7B:
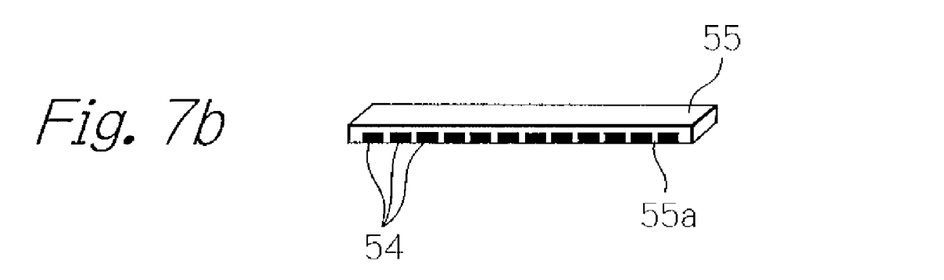
Figure 7C:
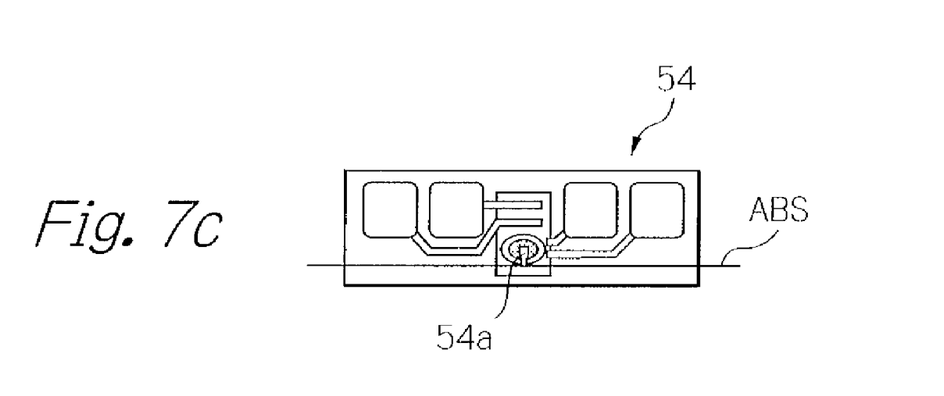

After the above-mentioned wafer process, a plurality of bars are obtained from the fabricated thin-film magnetic head wafer and MR height of each bar is adjusted. FIGS. 7a to 7c illustrate a part of this process for obtaining bars and for adjusting the MR height of each bar.

As shown in FIG. 7a, in the wafer process, many of thin-film magnetic heads are formed to arrange in matrix on an integration surface of the thin-film magnetic head wafer 53. The wafer 53 is then cut into a plurality of bars 55 so that each bar has a plurality of thin-film magnetic heads 54 aligned with each other as shown in FIG. 7b. Then, an ABS side surface 55a of each bar 55 is lapped to adjust the MR height. This MR-height adjustment is executed until a magnetic head element section 54a of each thin-film magnetic head 54 exposes at the ABS as shown in FIG. 7c.

According to the aforementioned processes of the first embodiment, because the cap layer 46 is thin at the milling for defining the track width, it is possible to narrow the width of the free layer. Also, because the additional metal layer 49 with the two-layered structure of the nonmagnetic metal layer 49a and the soft magnetic layer 49b is existed on the MR multi-layered structure when the overlapped part of the insulation layer and else in the region of the MR multi-layered structure opposite to the ABS are removed and because the milling is terminated within the soft magnetic layer 49b and the nonmagnetic metal layer 49a is never etched at all, the overlapped part can be completely removed without damaging not only the MR multi-layered structure but also the nonmagnetic metal layer 49a and the cap layer 46 that define the read gap. Furthermore, since the soft magnetic layer 49b functions as a part of the upper magnetic shield layer, accuracy in thickness of the read gap can be extremely improved and the cap layer can be formed thin resulting a width of the free layer to narrow.

Figure 8A:
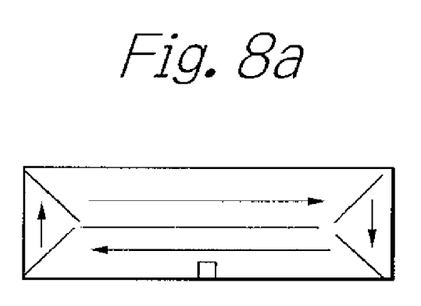
FIGS. 8a and 8b show views illustrating magnetization states in an upper shield layer part of the TMR read head element fabricated by the fabrication process shown in FIGS. 6a to 6k.
Figure 8B:
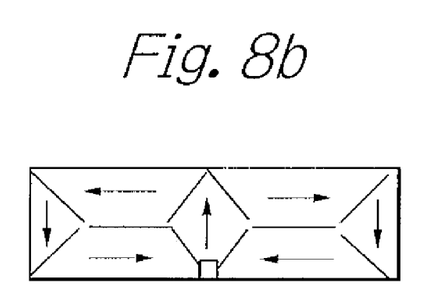

In addition, according to this first embodiment, it is possible to keep a steady output of the TMR read head element even under a narrow read gap. Namely, although magnetization of the upper magnetic shield layer near the TMR read head element should direct toward the track-width direction as shown in FIG. 8a, according to the conventional TMR read head elements, the magnetic domain may be sometimes ramified as shown in FIG. 8b. Thus, in the latter case, the output from the TMR read head element becomes unstable due to the interaction between the magnetic shield layer and the magnetic bias layer and/or the interaction between the magnetic shield layer and the free layer of the TMR multi-layered structure. However, according to the first embodiment, the soft magnetic layer 49b of the additional metal layer 49, which functions as a part of the upper magnetic shield layer, has an elongated shape along the track-width direction. Thus, this soft magnetic layer 49b is easily magnetized in the track-width direction due to shape anisotropy resulting that the output from the read head element becomes stable.

As shown in FIGS. 5a and 5b, the additional metal layer 49 in this first embodiment has a two-layered structure with the nonmagnetic metal layer 49a made of Ta or else with a thickness of 5 nm for example, and the soft magnetic layer 49b made of NiFe or else with a thickness of 5 to 50 nm, desirably 7 nm, for example and laminated in this order from the bottom. However, during deposition, a Ti film is deposited on the NiFe film in order to protect this NiFe film from oxidation. Therefore, the film structure of the additional metal layer 49 during the deposition is Ta film (thickness: 5 nm)/NiFe film (thickness: 10-55 nm)/Ti film (thickness: 2 nm) laminated in this order from the bottom. Since the Ti film is removed midway through fabrication process, the additional metal layer 49 in this first embodiment has finally the two-layered structure of Ta film (thickness: 5 nm)/NiFe film (thickness: 10-55 nm).

Table 1 represents a concrete example of layer structure of the TMR read head element part of the thin-film magnetic head in this first embodiment. In this Table, a layer represented by a plurality of materials has a multi-layered structure and a layer indicated left hand is a lower side layer. Also, values inside parentheses show layer thickness.

TABLE 1

| | |
|---|---|
| Insulation Layer 50 | $Al_2O_3$(60 nm) |
| Magnetic Bias Layer 48 | Cr(5 nm)/CoPt(25 nm)/Ta(5 nm) |
| Insulation Layer 47 | $Al_2O_3$(5 nm) |
| Upper Magnetic Shield Layer 52 | NiFe(2000 nm) |
| Upper Electrode Layer 51 | NiFe(50 nm) |
| Additional Metal Layer 49 | 49a/49b = Ta(5 nm)/NiFe(5-50 nm) |

TABLE 1-continued

| | |
|---|---|
| Cap Layer 46 | Ta(5 nm) |
| Magnetization-Free Layer 45 | CoFe(1 nm)/NiFe(3 nm) |
| Tunnel Barrier Layer 44 | $Al_2O_3$(0.6 nm) |
| Magnetization-Fixed Layer 43 | IrMn(7 nm)/CoFe(2 nm)/Ru(0.8 nm)/CoFe(3 nm) |
| Lower Metal Layer 42 | Ta(1 nm)/Ru(2 nm) |
| Lower Magnetic Shield Layer 40 | NiFe(2000 nm) |

Figure 9:
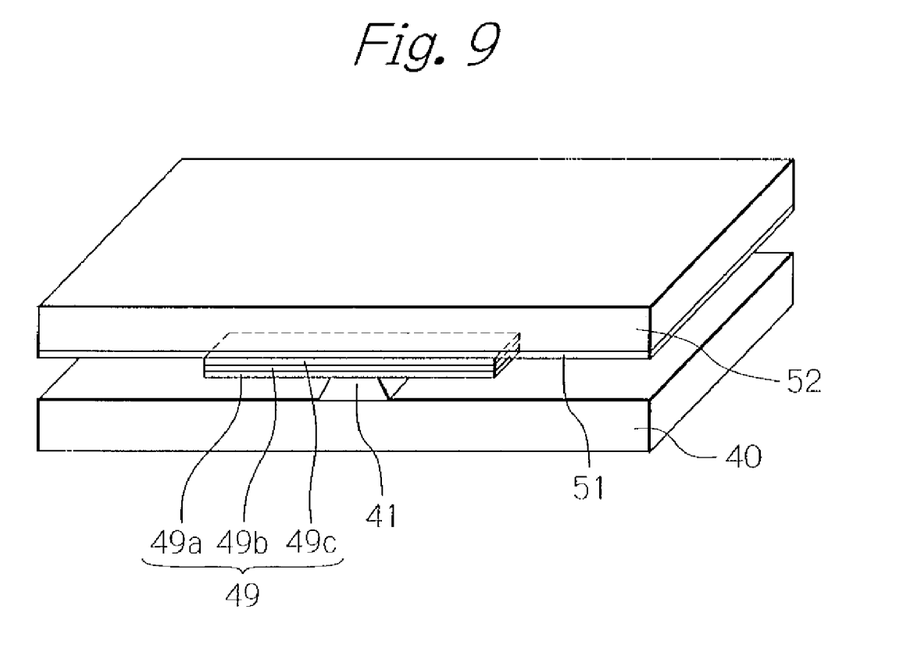
FIG. 9 shows a perspective view schematically illustrating a TMR read head element part of a thin-film magnetic head after an MR-height adjustment process as a second embodiment according to the present invention.

FIG. 9 schematically illustrates a TMR read head element part of a thin-film magnetic head after an MR-height adjustment process as a second embodiment according to the present invention. In the figure, to ensure greater ease in understanding the present invention, indicated are only main layers.

As shown in the figure, a TMR multi-layered structure 41, an additional metal layer 49 and an upper electrode layer 51 are formed between a lower magnetic shield layer 40 that doubles as a lower electrode and an upper magnetic shield layer 52 that doubles as an upper electrode. The additional metal layer 49 has a three-layered structure with a nonmagnetic metal layer 49a, a soft magnetic layer 49b laminated on the nonmagnetic metal layer 49a, and an additional nonmagnetic metal layer 49c. A length of the additional metal layer 49 along a track-width direction of the TMR multi-layered structure 41 is larger than a width of a free layer in the TMR multi-layered structure 41, and a length of the additional metal layer 49 along a direction perpendicular to the track-width direction of the TMR multi-layered structure 41, that is more precisely along a direction perpendicular to the ABS or along an MR-height direction, is substantially the same as a length of the TMR multi-layered structure 41 along this direction (MR height).

The additional metal layer 49 in this second embodiment has a three-layered structure with the nonmagnetic metal layer 49a made of Ta or else with a thickness of 5 nm for example, the soft magnetic layer 49b made of NiFe or else with a thickness of 5 to 50 nm, desirably 7 nm, for example and the additional nonmagnetic metal layer 49c made of Ti, Cr, Ta, Ru, Cu, gold (Au), silver (Ag) or else with a thickness of 0.1 to 2 nm for example, and laminated in this order from the bottom. By additionally laminating such extremely thin additional nonmagnetic metal layer 49c, the magnetic coupling between the upper magnetic shield layer 52 and the additional metal layer 49 can be blocked to provide more positively anisotropy to the soft magnetic layer 49b of the additional metal layer 49.

In a modification of this second embodiment, the additional metal layer 49 may have a three-layered structure with the nonmagnetic metal layer 49a made of Ta or else with a thickness of 5 nm for example, the soft magnetic layer 49b made of NiFe or else with a thickness of 5 to 50 nm, desirably 7 nm, for example and an additional anti-ferromagnetic layer 49c made of IrMn, RuRhMn, PtMn or else with a thickness of 4 nm for example, and laminated in this order from the bottom. By additionally laminating such anti-ferromagnetic layer 49c, the magnetic coupling between the upper magnetic shield layer 52 and the additional metal layer 49 can be blocked to provide more positive anisotropy to the soft magnetic layer 49b of the additional metal layer 49.

Table 2 represents a concrete example of layer structure of the TMR read head element part of the thin-film magnetic head in this second embodiment. In this Table, a layer represented by a plurality of materials has a multi-layered structure and a layer indicated left hand is a lower side layer. Also, values inside parentheses show layer thickness.

TABLE 2

| | |
|---|---|
| Insulation Layer 50 | Al$_2$O$_3$(60 nm) |
| Magnetic Bias Layer 48 | Cr(5 nm)/CoPt(25 nm)/Ta(5 nm) |
| Insulation Layer 47 | Al$_2$O$_3$(5 nm) |
| Upper Magnetic Shield Layer 52 | NiFe(2000 nm) |
| Upper Electrode Layer 51 | NiFe(50 nm) |
| Additional Metal Layer 49 | 49a/49b/49c = Ta(5 nm)/NiFe(5-50 nm)/Ti(1 nm), or 49a/49b/49c = Ta(5 nm)/NiFe(5-50 nm)/IrMn(4 nm) |
| Cap Layer 46 | Ta(5 nm) |
| Magnetization-Free Layer 45 | CoFe(1 nm)/NiFe(3 nm) |
| Tunnel Barrier Layer 44 | Al$_2$O$_3$(0.6 nm) |
| Magnetization-Fixed Layer 43 | IrMn(7 nm)/CoFe(2 nm)/Ru(0.8 nm)/CoFe(3 nm) |
| Lower Metal Layer 42 | Ta(1 nm)/Ru(2 nm) |
| Lower Magnetic Shield Layer 40 | NiFe(2000 nm) |

Figure 10:
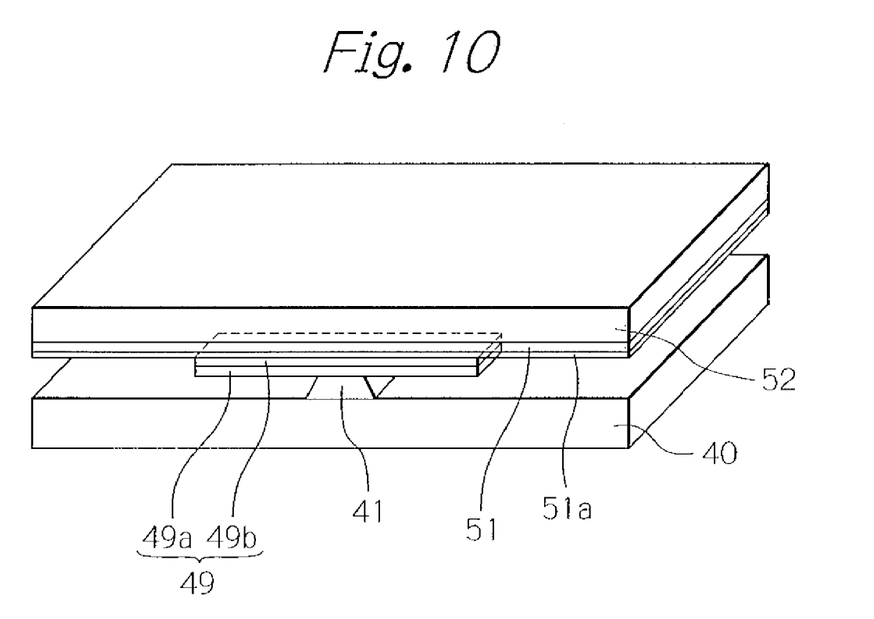
FIG. 10 shows a perspective view schematically illustrating a TMR read head element part of a thin-film magnetic head after an MR-height adjustment process as a third embodiment according to the present invention.

FIG. 10 schematically illustrates a TMR read head element part of a thin-film magnetic head after an MR-height adjustment process as a third embodiment according to the present invention. In the figure, to ensure greater ease in understanding the present invention, indicated are only main layers.

As shown in the figure, a TMR multi-layered structure 41, an additional metal layer 49 and an upper electrode layer 51 are formed between a lower magnetic shield layer 40 that doubles as a lower electrode and an upper magnetic shield layer 52 that doubles as an upper electrode. The additional metal layer 49 has a two-layered structure with a nonmagnetic metal layer 49a and a soft magnetic layer 49b laminated on the nonmagnetic metal layer 49a. On the additional metal layer 49, an additional nonmagnetic metal layer 51a that constitutes a part of the upper electrode layer 51 is laminated. The upper electrode layer 51 and the upper magnetic shield layer 52 are sequentially laminated thereon. A shape of the nonmagnetic metal layer 49a and the soft magnetic layer 49b of the additional metal layer 49 is such that its length along a track-width direction of the TMR multi-layered structure 41 is larger than a width of a free layer in the TMR multi-layered structure 41, and that its length along a direction perpendicular to the track-width direction of the TMR multi-layered structure 41, that is more precisely along a direction perpendicular to the ABS or along an MR-height direction, is substantially the same as a length of the TMR multi-layered structure 41 along this direction (MR height). Whereas a shape of the additional nonmagnetic metal layer 51a of the upper electrode layer 51 is the same as that of the upper electrode layer 51 and the upper magnetic shield layer 52.

As mentioned above, according to the third embodiment, the extremely thin additional nonmagnetic metal layer 51a made of Ti, Cr, Ta, Ru, Cu, Au, Ag or else with a thickness of 0.1 to 2 nm for example is laminated on the additional metal layer 49, and the upper electrode layer 51 is laminated thereon. By additionally laminating such extremely thin additional nonmagnetic metal layer 51a, the magnetic coupling at this region between the upper magnetic shield layer 52 and the additional metal layer 49 can be blocked to provide more positively anisotropy to the soft magnetic layer 49b of the additional metal layer 49.

In a modification of this third embodiment, an additional anti-ferromagnetic layer 51a made of IrMn, RuRhMn, PtMn or else with a thickness of 4 nm for example may be laminated on the additional metal layer 49 and the upper electrode layer 51 may be laminated thereon. By additionally laminating such anti-ferromagnetic layer 51a, the magnetic coupling at this region between the upper magnetic shield layer 52 and the additional metal layer 49 can be blocked to provide more positive anisotropy to the soft magnetic layer 49b of the additional metal layer 49.

Table 3 represents a concrete example of layer structure of the TMR read head element part of the thin-film magnetic head in this third embodiment. In this Table, a layer represented by a plurality of materials has a multi-layered structure and a layer indicated left hand is a lower side layer. Also, values inside parentheses show layer thickness.

TABLE 3

| | |
|---|---|
| Insulation Layer 50 | Al$_2$O$_3$(60 nm) |
| Magnetic Bias Layer 48 | Cr(5 nm)/CoPt(25 nm)/Ta(5 nm) |
| Insulation Layer 47 | Al$_2$O$_3$(5 nm) |
| Upper Magnetic Shield Layer 52 | NiFe(2000 nm) |
| Upper Electrode Layer 51 | 51a/51 = Ti(1 nm)/NiFe(50 nm), or 51a/51 = IrMn(4 nm)/NiFe(50 nm) |
| Additional Metal Layer 49 | 49a/49b = Ta(5 nm)/NiFe(5-50 nm) |
| Cap Layer 46 | Ta(5 nm) |
| Magnetization-Free Layer 45 | CoFe(1 nm)/NiFe(3 nm) |
| Tunnel Barrier Layer 44 | Al$_2$O$_3$(0.6 nm) |
| Magnetization-Fixed Layer 43 | IrMn(7 nm)/CoFe(2 nm)/Ru(0.8 nm)/CoFe(3 nm) |
| Lower Metal Layer 42 | Ta(1 nm)/Ru(2 nm) |
| Lower Magnetic Shield Layer 40 | NiFe(2000 nm) |

Many widely different embodiments of the present invention may be constructed without departing from the spirit and scope of the present invention. It should be understood that the present invention is not limited to the specific embodiments described in the specification, except as defined in the appended claims.

The invention claimed is:

1. A thin-film magnetic head, comprising:
a lower magnetic shield layer;
a magnetoresistive effect multi-layered structure formed on said lower magnetic shield layer so that current flows in a direction perpendicular to surfaces of laminated layers;
an insulation layer formed to surround said magnetoresistive effect multi-layered structure;
an additional metal layer laminated on at least said magnetoresistive effect multi-layered structure;
an upper electrode layer made of a soft magnetic material laminated on said additional metal layer and said insulation layer; and
an upper magnetic shield layer laminated on said upper electrode layer,
said additional metal layer having a multi-layered structure including a nonmagnetic metal layer and a soft magnetic layer laminated on said nonmagnetic metal layer, and having a length along a track-width direction of said magnetoresistive effect multi-layered structure larger than a width of a magnetization-free layer in said magnetoresistive effect multi-layered structure.

2. The thin-film magnetic head as claimed in claim 1, wherein said additional metal layer has a length being substantially the same as that of said magnetoresistive effect multi-layered structure, along a direction perpendicular to the track-width direction of said magnetoresistive effect multi-layered structure.

3. The thin-film magnetic head as claimed in claim 1, wherein said upper electrode layer is laminated on and directly joined with said soft magnetic layer of said additional metal layer.

4. The thin-film magnetic head as claimed in claim 1, wherein said upper electrode layer and said upper magnetic shield layer are integrally formed.

5. The thin-film magnetic head as claimed in claim 1, wherein said additional metal layer further has an additional nonmagnetic metal layer laminated on said soft magnetic layer, and wherein said upper electrode layer is laminated on said additional nonmagnetic metal layer of said additional metal layer.

6. The thin-film magnetic head as claimed in claim 1, wherein said additional metal layer further has an additional anti-ferromagnetic layer laminated on said soft magnetic layer, and wherein said upper electrode layer is laminated on said additional anti-ferromagnetic layer of said additional metal layer.

7. The thin-film magnetic head as claimed in claim 1, wherein said upper electrode layer is laminated on an additional nonmagnetic metal layer that is laminated on said soft magnetic layer of said additional metal layer, and wherein said additional nonmagnetic metal layer has the same plane shape as said upper magnetic shield layer.

8. The thin-film magnetic head as claimed in claim 1, wherein said upper electrode layer is laminated on an additional anti-ferromagnetic layer that is laminated on said soft magnetic layer of said additional metal layer, and wherein said additional anti-ferromagnetic layer has the same plane shape as said upper magnetic shield layer.

9. The thin-film magnetic head as claimed in claim 1, wherein said soft magnetic layer of said additional metal layer is made of the same soft magnetic material as said upper magnetic shield layer.

10. The thin-film magnetic head as claimed in claim 1, wherein said soft magnetic layer of said additional metal layer is made of a soft magnetic material different from that of said upper magnetic shield layer.

11. The thin-film magnetic head as claimed in claim 1, wherein said magnetoresistive effect multi-layered structure is a tunnel magnetoresistive effect multi-layered structure or a current perpendicular to plane type giant magnetoresistive effect multi-layered structure.

* * * * *